United States Patent
Andrews et al.

(10) Patent No.: US 7,230,810 B1
(45) Date of Patent: Jun. 12, 2007

(54) DYNAMIC OVER-VOLTAGE PROTECTION SCHEME FOR INTEGRATED-CIRCUIT DEVICES

(75) Inventors: William B. Andrews, Emmaus, PA (US); Mou C. Lin, High Ridge, NJ (US); Larry R. Fenstermaker, Nazareth, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 237 days.

(21) Appl. No.: 11/007,954

(22) Filed: Dec. 9, 2004

(51) Int. Cl.
*H02H 9/04* (2006.01)

(52) U.S. Cl. .................................. 361/91.1
(58) Field of Classification Search ............... 361/91.1
See application file for complete search history.

(56) References Cited

U.S. PATENT DOCUMENTS

| | | | |
|---|---|---|---|
| 5,160,855 A * | 11/1992 | Dobberpuhl | 327/108 |
| 5,574,389 A * | 11/1996 | Chu | 326/81 |
| 5,646,550 A * | 7/1997 | Campbell et al. | 326/81 |
| 5,933,025 A | 8/1999 | Nance et al. | |
| 5,933,027 A | 8/1999 | Morris et al. | |
| 6,028,450 A | 2/2000 | Nance | |
| 6,064,231 A | 5/2000 | Kothandaraman et al. | |
| 6,313,661 B1 | 11/2001 | Hsu | |
| 6,344,958 B1 * | 2/2002 | Morrill | 361/91.5 |
| 6,362,665 B1 * | 3/2002 | Davis et al. | 327/108 |
| 6,377,112 B1 * | 4/2002 | Rozsypal | 327/534 |
| 6,538,867 B1 * | 3/2003 | Goodell et al. | 361/91.1 |
| 7,046,074 B2 * | 5/2006 | Jang | 327/534 |

\* cited by examiner

*Primary Examiner*—Burton S. Mullins
*Assistant Examiner*—Ann T. Hoang
(74) *Attorney, Agent, or Firm*—Steve Mendelsohn

(57) ABSTRACT

An integrated circuit having a transistor device and over-voltage protection circuitry. The transistor device is implemented in a technology having a specified operating-voltage range, the transistor device having gate, drain, source, and tub nodes, and the specified operating-voltage range having a specified maximum voltage. The over-voltage protection circuitry is adapted to apply gate and tub voltages to the gate and tub nodes, respectively. If at least one channel voltage applied to at least one of the drain and source nodes exceeds the specified maximum voltage, then the over-voltage protection circuitry controls at least one of the gate voltage and the tub voltage to inhibit one or more adverse effects to the transistor device.

22 Claims, 4 Drawing Sheets

DYNAMIC OVER-VOLTAGE PROTECTION SCHEME FOR INTEGRATED-CIRCUIT DEVICES

TECHNICAL FIELD

The present invention relates to integrated circuitry, and, in particular, to techniques for protecting integrated circuitry from over-voltage conditions.

BACKGROUND

As technology advances and device speed requirements increase, the number of different input/output (I/O) interface standards also increases. Device I/O standards typically migrate to higher speeds and lower operating voltages. However, there remains a need for continued support of the older I/O standards, which typically operate at higher voltages and lower speeds. New technologies that operate at lower operating voltages with higher performance might not support the higher operating-voltage conditions of previous technologies. When new-technology devices (e.g., MOSFET transistors) are used in systems that operate at the higher operating-voltage conditions, the lifetime of those devices can be reduced due to over-voltage stress of the devices' gate oxide. N-type devices are particularly sensitive to over-voltage conditions due to the tub voltage of such a device being at a ground potential relative to the power supply or signaling standard, especially when the source or drain of the device is subjected to the over-voltage conditions.

SUMMARY

In one embodiment, the present invention is an integrated circuit comprising a transistor device and over-voltage protection circuitry. The transistor device is implemented in a technology having a specified operating-voltage range, the transistor device having gate, drain, source, and tub nodes, and the specified operating-voltage range having a specified maximum voltage. The over-voltage protection circuitry is adapted to apply gate and tub voltages to the gate and tub nodes, respectively. If at least one channel voltage applied to at least one of the drain and source nodes exceeds the specified maximum voltage, then the over-voltage protection circuitry controls at least one of the gate voltage and the tub voltage to inhibit one or more adverse effects to the transistor device.

In another embodiment, the present invention is a method for operating a transistor device implemented in a technology having a specified operating-voltage range, the transistor device having gate, drain, source, and tub nodes, and the specified operating-voltage range having a specified maximum voltage. The method comprises applying gate, drain, source, and tub voltages to the gate, drain, source, and tub nodes, respectively, of the transistor device, wherein if at least one channel voltage applied to at least one of the drain and source nodes exceeds the specified maximum voltage, then at least one of the gate voltage and the tub voltage is controlled to inhibit one or more adverse effects to the transistor device.

In yet another embodiment, the present invention is an apparatus for operating a transistor device implemented in a technology having a specified operating-voltage range, the transistor device having gate, drain, source, and tub nodes, and the specified operating-voltage range having a specified maximum voltage. The apparatus comprises (1) means for applying a gate voltage to the gate node of the transistor device, (2) means for applying a drain voltage to the drain node of the transistor device, (3) means for applying a source voltage to the source node of the transistor device, and (4) means for applying a tub voltage to the tub node of the transistor device, wherein if at least one channel voltage applied to at least one of the drain and source nodes exceeds the specified maximum voltage, then at least one of the gate voltage and the tub voltage is controlled to inhibit one or more adverse effects to the transistor device.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments.

Figure 1:
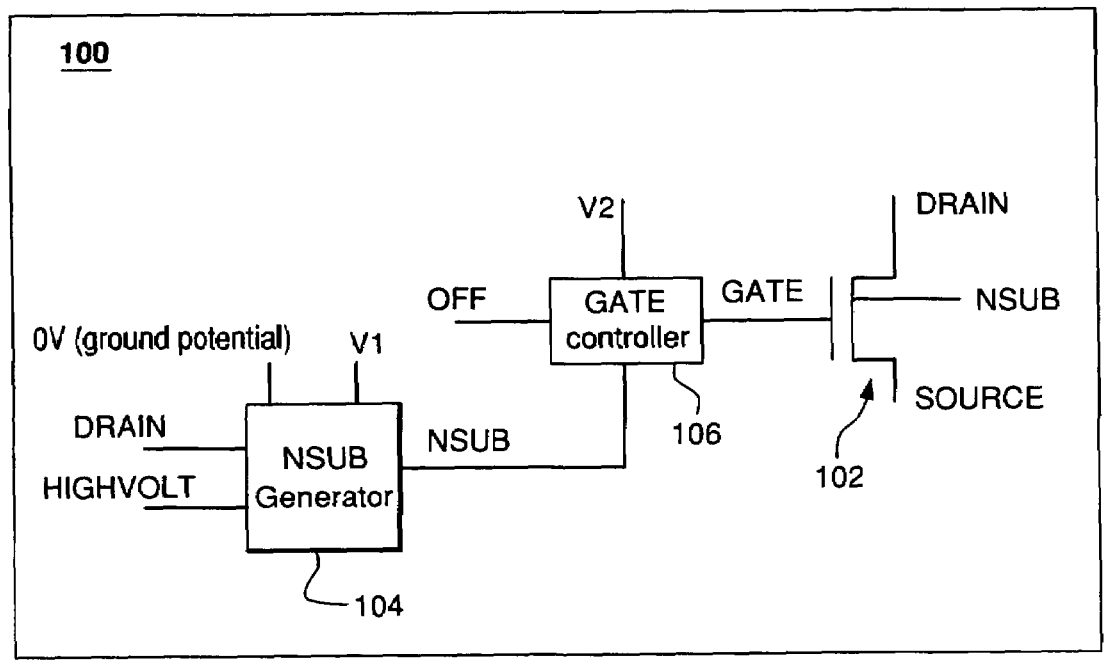
FIG. 1 shows a schematic block diagram of circuitry corresponding to an over-voltage protection scheme for N-type MOSFET devices, according to one embodiment of the present invention.

FIG. 1 shows a schematic block diagram of circuitry 100 corresponding to an over-voltage protection scheme for N-type MOSFET devices, according to one embodiment of the present invention. Circuitry 100 includes a conventional, N-type metal-oxide semiconductor, field-effect transistor (MOSFET) 102 and over-voltage protection circuitry comprising NSUB generator 104 and GATE controller 106.

N-type MOSFET 102 has (at least) four nodes: a GATE node adapted to receive the device gate voltage, a DRAIN node adapted to receive the device drain voltage, a SOURCE node adapted to receive the device source voltage, and an NSUB node adapted to receive the device tub voltage. In one possible implementation, MOSFET 102 is a triple-well device that enables the device's tub to be subjected to a voltage different from the integrated circuit's substrate potential, which is typically held at 0 volts relative to the IC's power supplies. In general, MOSFET 102 can be implemented using any suitable device that enables the device's tub to be subjected to a voltage different from the substrate potential. For simplicity, in this specification, the label "GATE" will be used to refer to the gate node of MOSFET 102 as well as to the voltage applied to the device's gate, and similarly for the labels "DRAIN," "SOURCE," and "NSUB."

In the particular over-voltage protection scheme of FIG. 1, it is assumed that the SOURCE voltage will always be within the voltage specifications for the technology corresponding to MOSFET 102, but that the DRAIN voltage may be outside (e.g., higher than) the specified range for that technology. Note that the present invention can be implemented for different sets of assumptions, e.g., where the DRAIN voltage is always within the technology's specified operating-voltage range, but where the SOURCE voltage may exceed that range.

As shown in FIG. 1, the NSUB voltage is generated by NSUB generator 104, and the GATE voltage is generated by GATE controller 106. NSUB generator 104 generates the NSUB voltage based on four input signals: a signal corresponding to the IC's substrate potential (typically 0V ground), a voltage V1, the DRAIN voltage, and a voltage signal HIGHVOLT. GATE controller 106 generates the GATE voltage based on three input signals: the NSUB voltage, a voltage signal OFF, and a voltage V2, where V2 is the normal power supply voltage for the technology of MOSFET 102.

Figure 2:
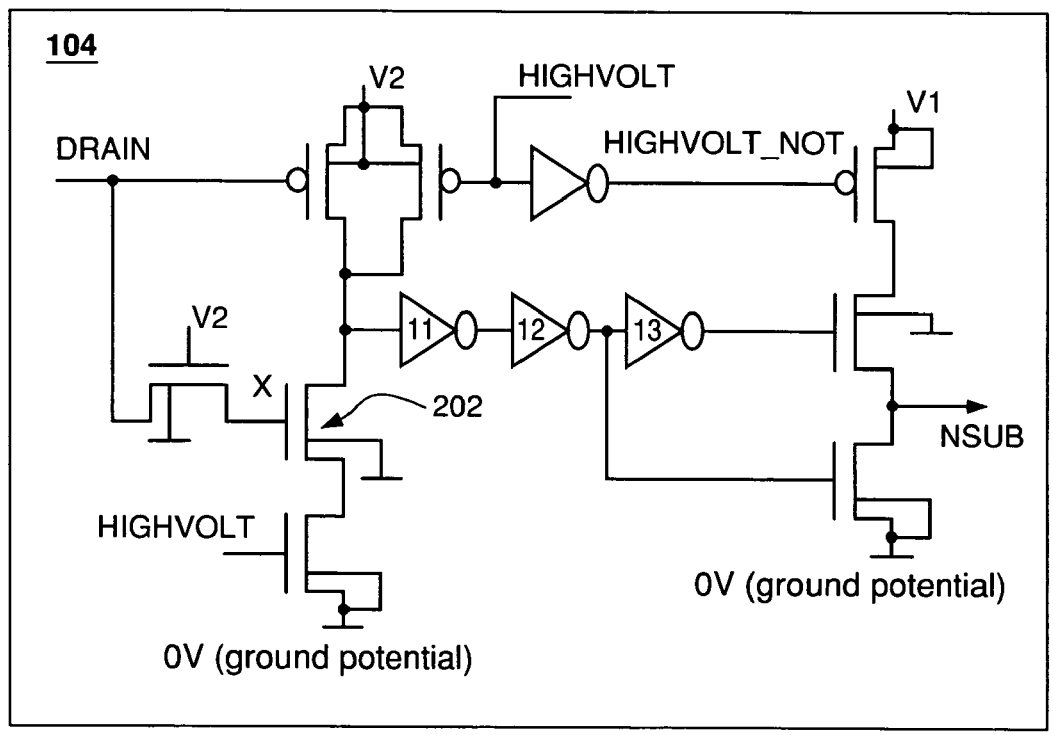
FIG. 2 shows a schematic diagram of NSUB generator 104 of FIG. 1, according to one embodiment of the present invention.

FIG. 2 shows a schematic diagram of NSUB generator 104 of FIG. 1, according to one embodiment of the present invention. NSUB generator 104 is programmed via the HIGHVOLT signal. The HIGHVOLT signal can be de-asserted (i.e., set to a sufficiently low voltage level), when the circuitry of FIG. 1 is configured in a system with voltages that stay within the technology's specified operating-voltage range. If the HIGHVOLT signal is de-asserted, then the NSUB voltage is driven to a ground potential, e.g., 0 volts relative to the power supplies.

The HIGHVOLT signal should be asserted (i.e., set to a sufficiently high voltage level), when the circuitry of FIG. 1 is configured in a system with voltages that can exceed the technology's specified operating-voltage range. If the HIGHVOLT signal is asserted, then the NSUB voltage is driven by switch circuitry within NSUB generator 104 that selects, based on the DRAIN voltage, the potential used to drive NSUB. In certain implementations, the circuitry can be designed such that the HIGHVOLT signal is always asserted.

In particular, in HIGHVOLT mode (i.e., with the HIGHVOLT signal asserted), if the DRAIN voltage is within the technology's specified operating-voltage range, then the switch circuitry drives the NSUB voltage to a ground potential (e.g., 0 volts) relative to the power supplies. If the DRAIN voltage is at a potential higher than the technology's specified operating-voltage range, then the switch circuitry drives the NSUB voltage to the voltage V1, where V1 is a voltage level that is lower than the DRAIN voltage, but higher than the ground potential. In particular, the voltage V1 is selected to keep the potential difference between the DRAIN voltage and the NSUB voltage within the technology's specified operating-voltage range. The voltage V1 also keeps the potential difference between the DRAIN voltage and the GATE voltage within the technology's specified operating-voltage range.

In the particular implementation of NSUB generator 104 shown in FIG. 2, the switch circuitry drives the NSUB voltage to the V1 level, if the DRAIN voltage is within a threshold voltage $V_{tn}$ of the power supply voltage V2, where $V_{tn}$ is the gate-to-source voltage level at which each of the MOSFET devices in FIG. 2 turns on. If the DRAIN voltage is below $(V2-V_{tn})$, then the voltage at node X is equal to the DRAIN voltage, where node X corresponds to the gate node of N-type MOSFET 202, which is implemented using the same technology (e.g., the same voltage-type device) as MOSFET 102 of FIG. 1. If, on the other hand, the DRAIN voltage rises above $(V2-V_{tn})$, then the voltage at node X stays at $(V2-V_{tn})$. This protects MOSFET 202 from being subjected to voltages outside the technology's specified operating-voltage range, yet still allows MOSFET 202 to be switched based on the DRAIN voltage.

Figure 3:
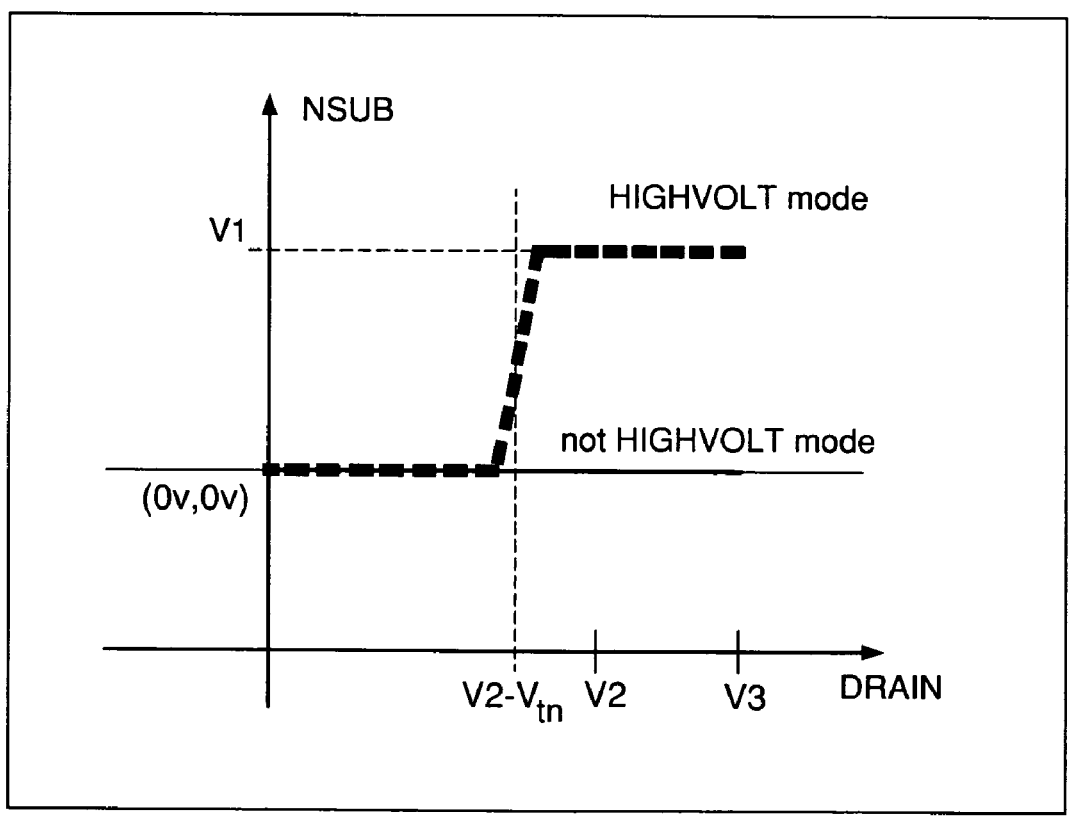
FIG. 3 shows a graphical representation of the relationship between the DRAIN voltage and the NSUB voltage for the circuitry of FIG. 1.

FIG. 3 shows a graphical representation of the relationship between the DRAIN voltage and the NSUB voltage. As indicated in FIG. 3, if the HIGHVOLT signal is de-asserted (i.e., not HIGHVOLT mode), then the NSUB voltage stays at 0V for all DRAIN voltage levels (up to a maximum over-voltage level V3). However, if the HIGHVOLT signal is asserted (i.e., HIGHVOLT mode), then the NSUB voltage remains at 0V for DRAIN voltages below about $(V2-V_{tn})$, while the NSUB voltage rises to the voltage V1 for DRAIN voltages above about $(V2-V_{tn})$ up to the maximum over-voltage level V3.

Figure 4:
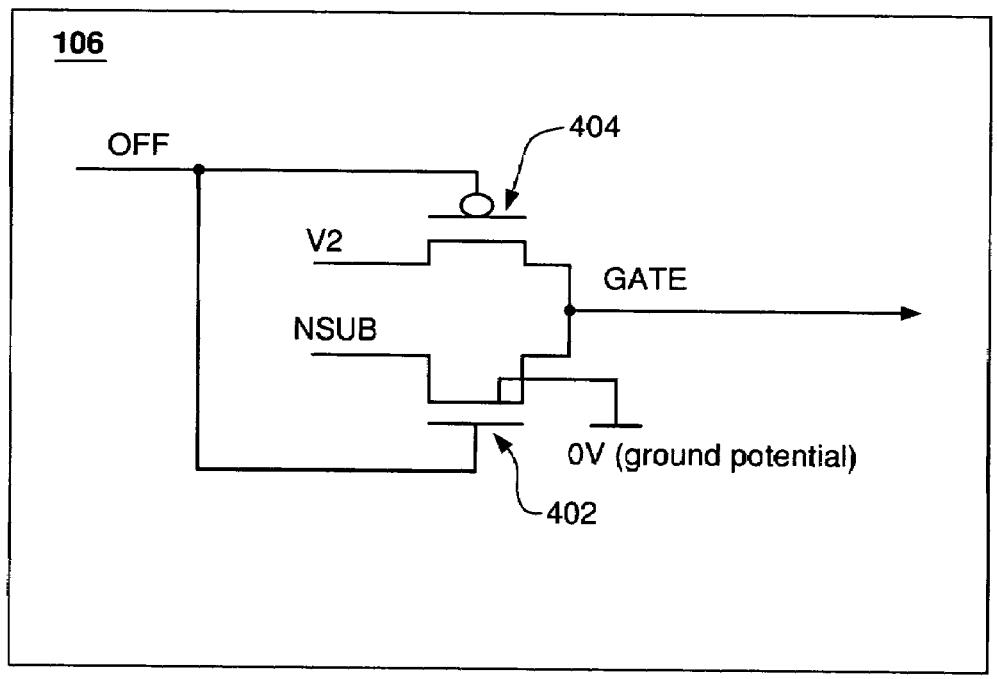
FIG. 4 shows a schematic diagram of gate controller 106 of FIG. 1, according to one embodiment of the present invention.

FIG. 4 shows a schematic diagram of gate controller 106 of FIG. 1, according to one embodiment of the present invention. If the OFF signal is low, then the voltage V2 is passed through device 404 to the GATE node. If, on the other hand, the OFF signal is high, then the NSUB voltage is passed through device 402 to the GATE node. If the OFF signal voltage is at a full high-voltage level for the technology and if the NSUB voltage is at either a 0V ground potential or the voltage V1 (or anywhere in between), then there is essentially no voltage drop through device 402. The NSUB voltage has a maximum voltage level V1 equal to or less than a potential drop below the voltage V2 (i.e., the technology's high-voltage level). The value of NSUB voltage level V1 is bounded by the relationship of Equation (1) as follows:

$$(V3_{max} - V2_{max}) \leq V1 \leq V2_{min} - V_{tn}, \qquad (1)$$

where $V3_{max}$ is the maximum DRAIN voltage level, $V2_{max}$ is the maximum value of the V2 power supply, and $V2_{min}$ is the minimum value of the V2 power supply.

In one exemplary implementation, V1 is one of the IC's power supply voltages VCC (e.g., for 1V devices), which ranges from about 0.95V to about 1.26V, $V3_{max}$ is the maximum VCC I/O voltage (about 3.45V), and V2 is the IC's power supply voltage for 2V devices, which ranges from about 2.3V to about 2.75V. Assuming a threshold voltage $V_{tn}$ of 0.8V, Equation (1) becomes Equation (2) as follows:

$$0.7V \leq V1 \leq 1.5. \qquad (2)$$

Thus, in this example, using power supply VCC for V1 satisfies Equation (2), with a worst-case margin of (0.95V–0.7V) or 0.25V and a best-case margin of (1.26V–0.7V) or 0.56V for N-type MOSFET devices having over-voltage levels applied to their DRAIN nodes. Depending on the implementation, V1 could be generated internally on the IC or by a separate power supply.

Referring again to FIG. 1, circuitry 100 supports two modes of operation: a normal operation mode and an over-voltage protection mode. The normal operation mode can be selected if the DRAIN voltage will stay within the technology's specified operating-voltage range, while the over-voltage protection mode should be selected if the DRAIN voltage might exceed that voltage range.

The normal operation mode is selected by de-asserting the HIGHVOLT signal to NSUB generator 104. In this case, NSUB generator 104 maintains the NSUB voltage at a 0V ground potential. As such, if the OFF signal applied to GATE controller 106 is high, then the GATE voltage applied to MOSFET 102 is set to the 0V NSUB voltage, at which MOSFET 102 is turned off. On the other hand, if the OFF signal is low, then the GATE voltage applied to MOSFET 102 is set to the voltage V2, at which MOSFET 102 is turned on. In either case, as long as the DRAIN voltage is within the technology's specified operating-voltage range, there is no danger of an over-voltage condition being applied to the DRAIN node of MOSFET 102.

For the same exemplary implementation described above with reference to Equation (2), during the normal mode, the maximum DRAIN voltage ($V3_{max}$) is equal to the maximum value of V2 ($V2_{max}$), and Equation (1) becomes Equation (3) as follows:

$$0V \leq V1 \leq 1.5V. \quad (3)$$

Since V1=0V during normal mode, Equation (3) is satisfied.

The over-voltage protection mode is selected by asserting the HIGHVOLT signal to NSUB generator 104. In this case, NSUB generator 104 maintains the NSUB voltage at a 0V ground potential as long as the DRAIN voltage is less than ($V2-V_{tn}$). As indicated in FIG. 3, however, when the DRAIN voltage exceeds ($V2-V_{tn}$), but not V3, NSUB generator 104 drives the NSUB voltage to V1. As in the normal operation mode, during the over-voltage protection mode, the OFF signal determines whether GATE controller 106 applies the voltage V2 or the NSUB voltage to the GATE node.

If the DRAIN voltage is less than ($V2-V_{tn}$), then MOSFET 102 sees the same voltages as in the normal operation mode. On the other hand, if the DRAIN voltage exceeds ($V2-V_{tn}$), then the voltage V1 is applied to the NSUB node of MOSFET 102. This keeps the drain-to-tub voltage difference for MOSFET 102 to within V3−V1. In addition, if the OFF signal is low, then the voltage V1 is also applied to the GATE node. This keeps the drain-to-gate voltage difference for MOSFET 102 to within V3−V1. If, however, the OFF signal is high, then the voltage V2 is applied to the GATE node. This keeps the drain-to-gate voltage difference for MOSFET 102 to within V3−V2. In either case, these voltage differences are sufficiently low to prevent device breakdown, destruction, lifetime reduction, or other adverse device characteristic effects of MOSFET 102 during over-voltage conditions when the DRAIN voltage exceeds the technology's specified operating-voltage range (but stays below V3, the maximum allowable over-voltage level), while still achieving the technology's high-speed operations.

If the source is at such a voltage that the drain to source voltage is greater than the V2max for the technology, then OFF must be equal to a one in order to keep device 102 off to prevent it from passing current. If the source is at a voltage such that source to drain voltage is less than the V2max for the technology, then OFF can be programmed to a one or a zero, allowing current to flow between the source and drain. The reason for this constraint is that the lifetime of the device is reduced much more when, in the overvoltage mode, when the source to drain voltage is greater than the 2V maximum and current is flowing through that source to drain path.

ALTERNATIVE EMBODIMENTS

Depending on the particular implementation, the transistor devices used to implement circuitry 100 of FIG. 1 can all be of the same voltage-type (e.g., all 1V devices or all 2V devices) or they can be of different voltage-types (e.g., one or more 1V devices and the rest 2V devices), depending on the particular ranges of voltage levels that those devices will see during operations.

Those skilled in the art will understand that the specific circuit implementations for NSUB generator 104 and GATE controller 106 shown in FIGS. 2 and 4 are merely exemplary and that equivalent or analogous functionality can be achieved using any other suitable circuit implementation. Furthermore, although the over-voltage protection circuitry is shown as being implemented by an NSUB generator and a GATE controller, alternative embodiments may implement the functionality of those two blocks in other ways, including implementations in which that functionality is implemented by a single block or by more than two blocks.

Although FIG. 2 shows three inverters (I1, I2, I3), in alternative embodiments, NSUB generator 104 can be implemented with other numbers of inverters including a single inverter to generate two output signals having inverted values analogous to the outputs of I2 and I3 in FIG. 2.

The present invention has been described in the context of circuitry to protect the DRAIN node of a transistor device from high voltages. As suggested previously, the present invention can alternatively be implemented with circuitry to protect the device's SOURCE node from high voltages, e.g., by applying the SOURCE voltage to NSUB generator 104 instead of the DRAIN voltage. Moreover, circuitry could be implemented with two NSUB generators, one receiving the SOURCE voltage and the other receiving the DRAIN voltage, where the greater of the two generated NSUB voltages is selected to be applied to the GATE controller to provide circuitry that can protect both the SOURCE node and the DRAIN node of a transistor device.

The present invention has been described in the context of circuitry 100 of FIG. 1, which shows a single NSUB generator, a single GATE controller, and a single MOSFET. Depending on the particular implementation, circuitry 100 may also include additional elements. For example, in an integrated circuit in which two or more different MOSFETs receive the same drain voltage (e.g., DRAIN of FIG. 1), a single NSUB generator can be used to generate the same NSUB voltage for each different MOSFET, each of which might have its own GATE controller. Moreover, if two or more of those MOSFETs also receive the same gate voltage (e.g., GATE of FIG. 1), then those MOSFETs could also share a single GATE controller.

Although the present invention has been described in the context of protecting MOSFETs from high voltages, the present invention can, in theory, also be implemented to protect other types of transistor devices such as, without limitation, other types of FETs, other types of MOS devices, and bipolar devices.

Although the present invention has been described in the context of applications in which the IC's substrate voltage is kept at a 0V "ground" potential, those skilled in the art will understand that the invention can also be implemented using a different voltage level for ground, where ground refers to a voltage level relative to the IC's power supplies.

The present invention can be implemented in the context of a wide variety of integrated circuits, including, but not limited to, programmable devices, such as, without limitation, field-programmable gate arrays (FPGAs), programmable logic devices (PLDs), mask-programmable gate arrays (MPGAs), simple programmable logic device (SPLDs), and complex programmable logic devices (CPLDs).

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

We claim:

1. An integrated circuit comprising:
   a transistor device implemented in a technology having a specified operating-voltage range, the transistor device having gate, drain, source, and tub nodes, and the specified operating-voltage range having a specified maximum voltage; and
   over-voltage protection circuitry adapted to apply gate and tub voltages to the gate and tub nodes, respectively, wherein:
      if at least one channel voltage applied to at least one of the drain and source nodes exceeds the specified maximum voltage, then the over-voltage protection circuitry controls at least one of the gate voltage and the tub voltage to inhibit one or more adverse effects to the transistor device;
      if the transistor device is to be turned on, then the over-voltage protection circuitry sets the gate voltage to the specified maximum voltage;
      if the transistor device is to be turned off, then the over-voltage protection circuitry sets the gate voltage to the tub voltage;
      the over-voltage protection circuitry is adapted to be programmably controlled to operate in either a normal operating mode or an over-voltage protection mode;
      in the normal operating mode, the over-voltage protection circuitry sets the tub voltage to a ground voltage; and
      in the over-voltage protection mode:
         if the channel voltage is less than a threshold voltage, then the over-voltage protection circuitry sets the tub voltage to the ground voltage; and
         if the channel voltage is greater than the threshold voltage, then the over-voltage protection circuitry sets the tub voltage to a first voltage less than the specified maximum voltage.

2. The invention of claim 1, wherein:
   the transistor device is an N-type MOSFET;
   the channel voltage is a drain voltage applied to the drain node; and
   the one or more adverse effects include one or more of destruction and breakdown of the transistor device.

3. The invention of claim 1, wherein the over-voltage protection circuitry controls both the gate voltage and the tub voltage to inhibit the one or more adverse effects.

4. The invention of claim 1, wherein the over-voltage protection circuitry is adapted to receive the channel voltage and generate both the tub voltage and the gate voltage.

5. The invention of claim 1, wherein the first voltage is greater than or equal to a voltage difference between a maximum over-voltage and the specified maximum voltage.

6. The invention of claim 5, wherein the first voltage is greater than the voltage difference by a selected voltage margin.

7. The invention of claim 1, wherein the over-voltage protection circuitry is further adapted to receive a control signal that selectively enables an over-voltage protection function of the over-voltage protection circuitry.

8. The invention of claim 7, wherein the control signal selectively disables the over-voltage protection circuitry from setting the tub voltage to anything but a ground voltage.

9. The invention of claim 1, wherein the over-voltage protection circuitry comprises:
   a tub-voltage generator adapted to receive the channel voltage and generate the tub voltage; and
   a gate-voltage generator adapted to receive the tub voltage and generate the gate voltage.

10. The invention of claim 9, wherein the tub-voltage generator is adapted to:
    receive a ground voltage and a first voltage;
    set the tub voltage to the ground voltage, if the channel voltage is less than a threshold voltage; and
    set the tub voltage to the first voltage, if the channel voltage is greater than the threshold voltage.

11. The invention of claim 10, wherein the first voltage is less than the specified maximum voltage.

12. The invention of claim 10, wherein the threshold voltage is approximately equal to a difference between the specified maximum voltage and a gate voltage at which the transistor device turns on.

13. The invention of claim 10, wherein the tub-voltage generator is further adapted to receive a control signal that selectively disables the tub-voltage generator from setting the tub voltage to anything but the ground voltage.

14. The invention of claim 9, wherein the gate-voltage generator is adapted to:
    set the gate voltage to the specified maximum voltage, if the transistor device is to be turned on; and
    set the gate voltage to the tub voltage, if the transistor device is to be turned off.

15. The invention of claim 1, wherein:
    the over-voltage protection circuitry is adapted to receive the channel voltage and generate both the tub voltage and the gate voltage to inhibit the one or more adverse effects;
    the first voltage is greater than a voltage difference between a maximum over-voltage and the specified maximum voltage by a selected voltage margin; and
    the over-voltage protection circuitry is further adapted to receive a control signal that selectively enables the over-voltage protection function of the over-voltage protection circuitry, wherein the control signal selectively disables the tub-voltage generator from setting the tub voltage to anything but the ground voltage.

16. The invention of claim 15, wherein the over-voltage protection circuitry comprises:
    a tub-voltage generator adapted to receive the channel voltage and generate the tub voltage; and a gate-voltage generator adapted to receive the tub voltage and generate the gate voltage, wherein:
the tub-voltage generator is adapted to:
receive the ground voltage and the first voltage;
set the tub voltage to the ground voltage, if the channel voltage is less than the threshold voltage; and
set the tub voltage to the first voltage, if the channel voltage is greater than the threshold voltage;
the threshold voltage is approximately equal to a difference between the specified maximum voltage and a gate voltage at which the transistor device turns on;
the tub-voltage generator is further adapted to receive the control signal that selectively disables the tub-voltage generator from setting the tub voltage to anything but the ground voltage; and
the gate-voltage generator is adapted to:
set the gate voltage to the specified maximum voltage, if the transistor device is to be turned on; and
set the gate voltage to the tub voltage, if the transistor device is to be turned off.

17. A method for operating a transistor device implemented in a technology having a specified operating-voltage range, the transistor device having gate, drain, source, and tub nodes, and the specified operating-voltage range having a specified maximum voltage, the method comprising applying gate, drain, source, and tub voltages to the gate, drain, source, and tub nodes, respectively, of the transistor device, wherein:
if at least one channel voltage applied to at least one of the drain and source nodes exceeds the specified maximum voltage, then at least one of the gate voltage and the tub voltage is controlled to inhibit one or more adverse effects to the transistor device;
if the transistor device is to be turned on, then the over-voltage protection circuitry sets the gate voltage to the specified maximum voltage;
if the transistor device is to be turned off, then the over-voltage protection circuitry sets the gate voltage to the tub voltage;
the over-voltage protection circuitry is adapted to be programmably controlled to operate in either a normal operating mode or an over-voltage protection mode;
in the normal operating mode, the over-voltage protection circuitry sets the tub voltage to a around voltage; and
in the over-voltage protection mode:
if the channel voltage is less than a threshold voltage, then the over-voltage protection circuitry sets the tub voltage to the ground voltage; and
if the channel voltage is greater than the threshold voltage, then the over-voltage protection circuitry sets the tub voltage to a first voltage less than the specified maximum voltage.

18. An apparatus for operating a transistor device implemented in a technology having a specified operating-voltage range, the transistor device having gate, drain, source, and tub nodes, and the specified operating-voltage range having a specified maximum voltage, the apparatus comprising:
means for applying a gate voltage to the gate node of the transistor device;
means for applying a drain voltage to the drain node of the transistor device;
means for applying a source voltage to the source node of the transistor device; and
means for applying a tub voltage to the tub node of the transistor device, wherein:
if at least one channel voltage applied to at least one of the drain and source nodes exceeds the specified maximum voltage, then at least one of the gate voltage and the tub voltage is controlled to inhibit one or more adverse effects to the transistor device;
if the transistor device is to be turned on, then the over-voltage protection circuitry sets the gate voltage to the specified maximum voltage;
if the transistor device is to be turned off, then the over-voltage protection circuitry sets the gate voltage to the tub voltage;
the over-voltage protection circuitry is adapted to be programmably controlled to operate in either a normal operating mode or an over-voltage protection mode;
in the normal operating mode, the over-voltage protection circuitry sets the tub voltage to a ground voltage; and
in the over-voltage protection mode:
if the channel voltage is less than a threshold voltage, then the over-voltage protection circuitry sets the tub voltage to the ground voltage; and
if the channel voltage is greater than the threshold voltage, then the over-voltage protection circuitry sets the tub voltage to a first voltage less than the specified maximum voltage.

19. An integrated circuit comprising:
a transistor device implemented in a technology having a specified operating-voltage range, the transistor device having gate, drain, source, and tub nodes, and the specified operating-voltage range having a specified maximum voltage;
over-voltage protection circuitry adapted to apply gate and tub voltages to the gate and tub nodes, respectively, wherein:
if at least one channel voltage applied to at least one of the drain and source nodes exceeds the specified maximum voltage, then the over-voltage protection circuitry controls at least one of the gate voltage and the tub voltage to inhibit one or more adverse effects to the transistor device;
the over-voltage protection circuitry comprises:
a tub-voltage generator adapted to receive the channel voltage and generate the tub voltage; and
a gate-voltage generator adapted to receive the tub voltage and generate the gate voltage; the tub-voltage generator is adapted to:
receive a ground voltage and a first voltage;
set the tub voltage to the ground voltage, if the channel voltage is less than a threshold voltage; and
set the tub voltage to the first voltage, if the channel voltage is greater than the threshold voltage; and
at least one of:
(i) the first voltage is less than the specified maximum voltage;
(ii) the threshold voltage is approximately equal to a difference between the specified maximum voltage and a gate voltage at which the transistor device turns on; and
(iii) the tub-voltage generator is further adapted to receive a control signal that selectively disables the tub-voltage generator from setting the tub voltage to anything but the ground voltage.

20. The invention of claim 19, wherein the first voltage is less than the specified maximum voltage.

21. The invention of claim 19, wherein the threshold voltage is approximately equal to the difference between the specified maximum voltage and the gate voltage at which the transistor device turns on.

22. The invention of claim 19, wherein the tub-voltage generator is further adapted to receive the control signal that selectively disables the tub-voltage generator from setting the tub voltage to anything but the ground voltage.

* * * * *